United States Patent
Lee et al.

(10) Patent No.: US 12,258,508 B2
(45) Date of Patent: Mar. 25, 2025

(54) SEMICONDUCTOR NANOPARTICLES, A COLOR CONVERSION MEMBER FOR A DISPLAY DEVICE INCLUDING THE SAME, AN ELECTRONIC APPARATUS INCLUDING THE SEMICONDUCTOR NANOPARTICLES, AND A METHOD OF MANUFACTURING THE SEMICONDUCTOR NANOPARTICLES

(71) Applicants: Samsung Display Co., Ltd., Yongin-si (KR); Hongik University Industry-Academia Cooperation Foundation, Seoul (KR)

(72) Inventors: Hyeokjin Lee, Yongin-si (KR); Heesun Yang, Seoul (KR); Sunyoung Kwon, Yongin-si (KR); Youngsoo Kwon, Yongin-si (KR); Keunchan Oh, Yongin-si (KR); Jungho Jo, Seoul (KR)

(73) Assignees: SAMSUNG DISPLAY CO., LTD., Yongin-si (KR); HONGIK UNIVERSITY INDUSTRY-ACADEMIA COOPERATION FOUNDATION, Seoul (KR)

( * ) Notice: Subject to any disclaimer, the term of this patent is extended or adjusted under 35 U.S.C. 154(b) by 415 days.

(21) Appl. No.: 17/522,904

(22) Filed: Nov. 10, 2021

(65) Prior Publication Data

US 2022/0146724 A1 May 12, 2022

(30) Foreign Application Priority Data

Nov. 11, 2020 (KR) .................. 10-2020-0150506

(51) Int. Cl.
*H10K 50/115* (2023.01)
*C09K 11/70* (2006.01)
(Continued)

(52) U.S. Cl.
CPC ............ *C09K 11/883* (2013.01); *C09K 11/70* (2013.01); *H10K 50/115* (2023.02); *B82Y 20/00* (2013.01); *B82Y 40/00* (2013.01); *H10K 59/38* (2023.02)

(58) Field of Classification Search
None
See application file for complete search history.

(56) References Cited

U.S. PATENT DOCUMENTS

| 8,343,576 B2 | 1/2013 | Banin et al. |
| 9,631,141 B2 | 4/2017 | Guo et al. |

(Continued)

FOREIGN PATENT DOCUMENTS

| CN | 108239535 A | 7/2018 |
| KR | 20080046158 | 5/2008 |

(Continued)

OTHER PUBLICATIONS

Lim, Jaehoon, et al. "InP@ZnSeS, Core@Composition Gradient Shell Quantum Dots with Enhanced Stability." Chemistry of Materials, vol. 23, No. 20, 2011, pp. 4459-4463.

(Continued)

*Primary Examiner* — Daniel Whalen
(74) *Attorney, Agent, or Firm* — KILE PARK REED & HOUTTEMAN PLLC

(57) ABSTRACT

A semiconductor nanoparticle for a color conversion member of a display device includes: a central portion including at least one of i) InP, ii) a ternary compound consisting of indium, phosphorus, and one element of Groups I-VII, and iii) InP doped with at least one transition metal of Groups I-VII; an inner portion proximate to the central portion and including a phosphide of at least one of boron, aluminum, and gallium; a middle portion proximate to the inner portion and including at least one of ZnSe and $ZnSe_xS_{1-x}$; and an (Continued)

outer portion proximate to the middle portion and including one or more compounds of Groups II-VI, wherein x is 0<x<1.

19 Claims, 5 Drawing Sheets

(51) Int. Cl.
   *C09K 11/88* (2006.01)
   *B82Y 20/00* (2011.01)
   *B82Y 40/00* (2011.01)
   *H10K 59/38* (2023.01)

(56) References Cited

U.S. PATENT DOCUMENTS

| | | | |
|---|---|---|---|
| 2018/0119007 A1 | 5/2018 | Ippen et al. | |
| 2019/0140113 A1 | 5/2019 | Jun et al. | |
| 2019/0211260 A1* | 7/2019 | Won | C09K 11/565 |
| 2019/0211262 A1 | 7/2019 | Park et al. | |
| 2019/0378959 A1 | 12/2019 | Won et al. | |
| 2020/0319516 A1 | 10/2020 | Park et al. | |
| 2020/0403126 A1* | 12/2020 | Owen | C09K 11/883 |

FOREIGN PATENT DOCUMENTS

| KR | 20140056500 | 5/2014 |
|---|---|---|
| KR | 20140117204 | 10/2014 |
| KR | 10-2018-0088552 | 8/2018 |
| KR | 20180094200 A | 8/2018 |
| KR | 20180108012 A | 10/2018 |
| KR | 20180135063 | 12/2018 |
| KR | 20190060753 A | 6/2019 |
| KR | 20190085884 A | 7/2019 |

OTHER PUBLICATIONS

Tessier, Mickael D., et al. "Economic and Size-Tunable Synthesis of INP/ZnE (E=S, Se) Colloidal Quantum Dots." Chemistry of Materials, vol. 27, No. 13, 2015, pp. 4893-4898.
Park, Joong Pill, et al. "Highly Luminescent INP/Gap/ZnS Qds Emitting in the Entire Color Range via a Heating up Process." Scientific Reports, vol. 6, No. 1, 2016.
Jo, Jung-Ho, et al. "High-Efficiency Red Electroluminescent Device Based on Multishelled INP Quantum Dots." Optics Letters, vol. 41, No. 17, 2016, p. 3984.
Li, Yang, et al. "Stoichiometry-Controlled INP-Based Quantum Dots: Synthesis, Photoluminescence, and Electroluminescence." Journal of the American Chemical Society, vol. 141, No. 16, 2019, pp. 6448-6452.
Ramasamy, Parthiban, et al. "Beneficial Effects of Water in the Colloidal Synthesis of INP/ZnS Core-Shell Quantum Dots for Optoelectronic Applications." Nanoscale, vol. 8, No. 39, 2016, pp. 17159-17168.
Song et al., "Amine-derived synthetic approach to color-tunable InP/ZnS quantum dots with high fluorescent qualities", J Nanopart Res (2013) 15:1750, DOI 10.1007/s11051-013-1750-y, pp. 1-10.

* cited by examiner

FIG. 4

| 1310 | | |
|---|---|---|
| 1340 | 1350 | 1360 |

1300 (brace for above two rows)

| 2340 |
|---|
| 2330 |
| 2320 |
| 2310 |

2300 (brace)

FIG. 5

| 1310 | | |
|---|---|---|
| 1340 | 1350 | 1360 |

1300

| 2410 |
|---|
| 2430 |
| 2420 |

| 1340 | 1350 | 1360 |
|---|---|---|

1300

| 2410 |
|---|
| 2430 |
| 2420 |

2400

SEMICONDUCTOR NANOPARTICLES, A COLOR CONVERSION MEMBER FOR A DISPLAY DEVICE INCLUDING THE SAME, AN ELECTRONIC APPARATUS INCLUDING THE SEMICONDUCTOR NANOPARTICLES, AND A METHOD OF MANUFACTURING THE SEMICONDUCTOR NANOPARTICLES

CROSS-REFERENCE TO RELATED APPLICATION

This application claims priority from and the benefit of Korean Patent Application No. 10-2020-0150506, filed on Nov. 11, 2020, which is hereby incorporated by reference for all purposes as if fully set forth herein.

BACKGROUND

Field

Embodiments of the invention relate generally to semiconductor nanoparticles, and, more specifically, to a color conversion member for a display device including the same, an electronic apparatus including the semiconductor nanoparticles, and a method of manufacturing the semiconductor nanoparticles.

Discussion of the Background

Semiconductor nanoparticles are nanocrystals of semiconductor materials, exhibit a quantum confinement effect, and are also called quantum dots. When quantum dots reach an energy excited state by receiving light from an excitation source, they emit energy according to a corresponding energy band gap by themselves. In this regard, even in the case of the same material, the wavelength varies depending on the particle size, and accordingly, by adjusting the size of the quantum dots, light having the desired wavelength range may be obtained, and excellent color purity and high luminescence efficiency may be obtained. Thus, the quantum dots may be applicable to various devices or apparatuses.

Lighting apparatuses can be used for a variety of applications. For example, lighting apparatuses can be used for indoor or outdoor lighting, stage lighting, decorative lighting, and backlight units (BLU) of liquid crystal displays (LCD) which are used in portable electronic products (such as mobile phones, camcorders, digital cameras, and personal digital assistants (PDAs)).

Typical uses of lighting apparatuses are, for example, BLUs of LCDs. LCDs are one of the most widely used flat panel displays, and include two display panels, on which electric field generating electrodes, such as a pixel electrode and a common electrode, are formed, and a liquid crystal layer located therebetween. An electric field is generated in a liquid crystal layer by applying voltage to the electric field generating electrode, and thus, the orientation of the liquid crystal molecules in the liquid crystal layer is determined and the polarization of incident light is controlled to display an image.

LCDs use a color conversion member to form color. When the light emitted from the backlight light source passes through the red, green, and blue color conversion members, the amount of light is reduced to about one-third by each color conversion member. Accordingly, the optical efficiency is low.

Photo-luminescent liquid crystal displays (PL-LCDs), which have been proposed due to the compensation for the decrease in optical efficiency and high color reproducibility, are LCDs in which a color conversion member, which is used in LCDs of the related art, is replaced with a quantum dot color conversion layer (QD-CCL). PL-LCDs display color images by using visible light that is generated when light of low-wavelength band, such as ultraviolet or blue light, generated from a light source and controlled by a liquid crystal layer is irradiated to and incident upon the color conversion layer (CCL).

The above information disclosed in this Background section is only for understanding of the background of the inventive concepts, and, therefore, it may contain information that does not constitute prior art.

SUMMARY

Semiconductor nanoparticles made according to the principles and illustrative embodiments of the invention for use in display devices and other electronic apparatus have a narrow full width at half maximum (FWHM) and excellent quantum efficiency. For example, according to one specific embodiment, the semiconductor particle may have a full width at half maximum (FWHM) of about 60 nm or less, for example, about 55 nm or less in an emission wavelength spectrum. When the FWHM satisfies this range, color purity and color reproducibility are excellent, and a wide viewing angle may be obtained.

Additional features of the inventive concepts will be set forth in the description which follows, and in part will be apparent from the description, or may be learned by practice of the inventive concepts.

According to one aspect of the invention, a semiconductor nanoparticle includes: a central portion including at least one of i) InP, ii) a ternary compound consisting of indium, phosphorus, and one element of Groups I-VII, and iii) InP doped with at least one transition metal of Groups I-VII; an inner portion proximate to the central portion and including a phosphide of at least one of boron, aluminum, and gallium; a middle portion proximate to the inner portion and including at least one of ZnSe and $ZnSe_xS_{1-x}$; and an outer portion proximate to the middle portion and including one or more compounds of Groups II-VI, wherein x is 0<x<1.

The semiconductor nanoparticle may be configured to emit visible light other than blue light.

The semiconductor nanoparticle may be configured to emit light having a maximum emission wavelength of about 500 nm to about 650 nm.

The central portion may include a core, the inner portion may include an inner shell directly covering the core, the middle portion may include a middle shell directly covering the inner shell, and the outer portion may include an outer shell directly covering the middle shell.

The central portion may include a core including at least one of InP, InGaP, InAlP, Cu-doped InP, Mn-doped InP, and Ag-doped InP.

The inner portion may include an inner shell including at least one of BP, AlP, and GaP.

The compound of Groups II-VI may include Zn, and may be a binary compound or a ternary compound.

The one or more compounds of Groups II-VI may include at least one of ZnS, ZnSe, ZnTe, ZnO, ZnSeS, ZnSeTe, and ZnSTe.

The one or more compounds of Groups II-VI may include ZnS.

The ratio of a total molar number of B, Al, or Ga contained in the inner portion to a molar number of In contained in the central portion may be about 0.01 to about 10.

The inner portion may include an inner shell having a thickness of about 0.1 nm to about 0.7 nm.

The full width at half maximum of an emission wavelength spectrum of the semiconductor nanoparticle may be about 60 nm or less.

The middle portion may include a middle shell including multi-layered shells and further includes, in a portion thereof adjacent to the inner portion, a doping layer containing at least one of ZnSe and $ZnSe_xS_{1-x}$ which may be doped with at least one metal of B, Al, and Ga and x has the same meaning as above.

According to another aspect of the invention, a color conversion member including a semiconductor nanoparticle that includes: a central portion including at least one of i) InP, ii) a ternary compound consisting of indium, phosphorus, and an element of Groups I-VII, and iii) InP doped with at least one transition metal of Groups I-VII; an inner portion covering the central portion and including a phosphide of at least one of boron, aluminum, and gallium; a middle portion covering the inner portion and including at least one of ZnSe and $ZnSe_xS_{1-x}$; and an outer portion covering the middle portion and including a compound of Groups II-VI, wherein x is 0<x<1.

An electronic apparatus may include the color conversion member as described above and a display.

At least one region of the color conversion member may include the semiconductor nanoparticle and may be configured to absorb visible light emitted from the display.

The at least one region of the color conversion member may be configured to emit visible light other than blue light.

The display device may include a liquid crystal display, an organic light-emitting display, or an inorganic light-emitting display.

A method of manufacturing a semiconductor nanoparticle may include the steps of: preparing a first material by reacting a first precursor including indium with aminophosphine; preparing a second material including at least one of ZnSe and $ZnSe_xS_{1-x}$; preparing a mixture including the first material, the second material, and a second precursor including boron, aluminum, or gallium; and adding a compound of Groups II-VI to the mixture.

Furthermore, the step of preparing the mixture including the first material, the second material, and the second precursor including boron, aluminum, or gallium may include: i) the second precursor may be added to the first material, and then the second material may be added thereto, or ii) the second material may be added to the first material, and then the second precursor may be added thereto, or iii) the second material and the second precursor may be simultaneously added to the first material.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

FIG. 4 is a schematic cross sectional view of an embodiment of an electronic apparatus constructed according to principles of the invention.

FIG. 5 is a schematic cross sectional view of another embodiment of an electronic apparatus constructed according to principles of the invention.

FIG. 6 is a schematic cross sectional view of a further embodiment of an electronic apparatus constructed according to principles of the invention.

DETAILED DESCRIPTION

Figure 1:
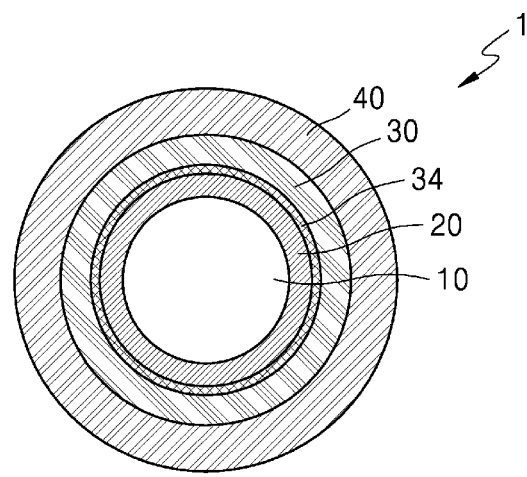
FIG. 1 is a schematic view illustrating an embodiment of a semiconductor nanoparticle constructed according to principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element or a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

The term "Group I" used herein may include Group IB elements on the IUPAC periodic table, and Group I elements may include, for example, copper (Cu), silver (Ag), gold (Au), and the like.

The term "Group II" used herein may include a Group IIA element and a Group IIB element on the IUPAC periodic table, and the Group II element includes, for example, magnesium (Mg), calcium (Ca), zinc (Zn), cadmium (Cd), and mercury (Hg).

The term "Group III" used herein may include a Group IIIA element and a Group IIIB element on the IUPAC periodic table, and the Group III element may include, for example, aluminum (Al), gallium (Ga), indium (In), and thallium (Tl).

The term "Group IV" used herein may include a Group IVA element and a Group IVB element on the IUPAC periodic table, and the Group IV element includes, for example, carbon (C), silicon (Si), germanium (Ge), tin (Sn), and lead (Pb).

The term "Group V" used herein may include a Group VA element and a Group VB element on the IUPAC periodic table, and the Group V element may include, for example, nitrogen (N), phosphorus (P), arsenic (As), and antimony (Sb).

The term "Group VI" used herein may include a Group VIA element and a Group VIB element on the IUPAC periodic table, and the Group VI element may include, for example, sulfur (S), selenium (Se), and tellurium (Te).

The term "Group VII" may include a Group VIIB element on the IUPAC periodic table, and the Group VII element may include, for example, manganese (Mn).

The term "element" including specific elements such as zinc, indium, and phosphorus, refer to their respective atoms and corresponding radicals.

FIG. 1 is a schematic view illustrating an embodiment of a semiconductor nanoparticle constructed according to principles of the invention.

The semiconductor nanoparticle 1 includes a central portion that may be in the form of a core 10 including at least one of i) InP, ii) a ternary compound including or consisting of indium (In), phosphorus (P), and one element of Group I to Group VII elements, and iii) InP doped with at least one transition metal of Group I to Group VII transition metals, an inner portion that may be in the form of an inner shell 20 proximate to and at least partially covering the core 10 and including a phosphide of at least one of boron (B), aluminum (Al), and gallium (Ga), a middle portion that may be in the form of a middle shell 30 proximate to and at least partially covering the inner shell 20 and including at least one of ZnSe and $ZnSe_xS_{1-x}$, and an outer portion that may be in the form of an outer shell 40 proximate to and at least partially covering the middle shell 30 and including one or more compounds of Groups II-VI compounds.

In an embodiment, the core 10 may include at least one of InP, InGaP, InAlP, Cu-doped InP, Mn-doped InP, and Ag-doped InP. In an embodiment, the core 10 may include InP. In an embodiment, the core 10 may have a radius of about 0.5 nm to about 2.5 nm, for example, about 0.6 nm to about 2.4 nm, or about 0.75 nm to about 2.25 nm, or about 1 nm to about 2 nm. The phosphide of the B, Al or Ga may be produced by performing a cation exchange reaction between the InP-based material contained in the core 10 and the B, Al or Ga-containing material introduced into the inner shell 20.

In an embodiment, the inner shell 20 may include at least one of BP, AlP, and GaP. In an embodiment, the inner shell 20 may include at least one of BP, and GaP. In an embodiment, the inner shell 20 may include GaP. In an embodiment, the ratio of the total molar number of B, Al or Ga contained in the inner shell 20 to the molar number of In contained in the core 10 may be from 0.01 to 10. When the above range is satisfied, the semiconductor nanoparticle 1 may exhibit excellent quantum efficiency. In an embodiment, the inner shell 20 may have a thickness of about 0.1 nm to about 0.7 nm, for example, about 0.1 nm to about 0.6 nm, or about 0.2 nm to about 0.6 nm. The inner shell 20 may suppress leakage of electrons in the core 10 to the middle shell 30 or the outer shell 40. The variable x in $ZnSe_xS_{1-x}$ may satisfy the condition of 0<x<1. The variable x represents the composition ratio of Se to Zn in $ZnSe_xS_{1-x}$ included in the middle shell 30 of the semiconductor nanoparticle 1.

The middle shell 30 may include at least one of ZnSe and $ZnSe_xS_{1-x}$ with variable x defined above. As the middle shell 30 contains at least one of ZnSe and $ZnSe_xS_{1-x}$, structural defects due to crystal decoupling of the middle shell 30 with respect to the outer shell 40 containing Group II-VI compounds are reduced. Accordingly, the middle shell 30 may have a thickness sufficient to protect the core 10. In an embodiment, the middle shell 30 may include ZnSe. In an embodiment, the middle shell 30 may include $ZnSe_xS_{1-x}$. In addition, in an embodiment, the middle shell 30 may include two or more types of $ZnSe_xS_{1-x}$ having different x values as defined above. In an embodiment, the middle shell 30 may include at least one of ZnSe, $ZnSe_{0.75}S_{0.25}$, $ZnSe_{0.66}S_{0.33}$, $ZnSe_{0.50}S_{0.50}$, and $ZnSe_{0.33}S_{0.66}$.

In an embodiment, the interface between the inner shell 20 and the middle shell 30 may have a concentration gradient in which the concentration of an element present in the middle shell 30 decreases toward the center of the semiconductor nanoparticle 1. In an embodiment, the middle shell 30 may have a thickness of about 0.5 nm to about 2 nm, for example, about 0.6 nm to about 1.9 nm, or about 0.7 nm to about 1.8 nm, or about 1.0 nm to about 1.7 nm, or about 1.2 nm to about 1.5 nm. In an embodiment, the middle shell 30 may be multi-layered shells, and may further include, in a portion thereof adjacent to the inner shell 20, a doping layer 34 containing at least one of ZnSe and $ZnSe_xS_{1-x}$ which are doped with at least one metal of B, Al, and Ga and the variable x is defined above. In an embodiment, the doping layer 34 may include at least one of ZnSe and $ZnSe_xS_{1-x}$ which are doped with at least one metal of B and Ga and the variable x is defined above.

The outer shell 40 includes Group II-VI compounds. In an embodiment, the middle shell 30 may be different from the outer shell 40. In an embodiment, the Group II-VI compounds may include Zn. In an embodiment, the Group II-VI compounds may be binary compounds or ternary compounds. In an embodiment, the Group II-VI compounds may be one or more compounds selected from ZnS, ZnSe, ZnTe, ZnO, ZnSeS, ZnSeTe, and ZnSTe. In an embodiment, the Group II-VI compounds may be ZnS.

In an embodiment, the interface between the middle shell 30 and the outer shell 40 may have a concentration gradient in which the concentration of an element present in the outer shell 40 decreases toward the center of the semiconductor nanoparticle 1. In an embodiment, the outer shell 40 may have a thickness of about 0.5 nm to about 2 nm, for example, about 0.6 nm to about 1.9 nm, or about 0.7 nm to about 1.8 nm, or about 1.0 nm to about 1.7 nm, or about 1.2 nm to about 1.5 nm. The middle shell 30 and outer shell 40 of the semiconductor nanoparticle 1 may act as a protective layer to prevent chemical degeneration of the core 10 and maintain semiconductor characteristics and/or act as a charging layer to impart electrophoretic characteristics to the semiconductor nanoparticle 1.

In an embodiment, the semiconductor nanoparticle may emit visible light other than blue light. In an embodiment, the semiconductor nanoparticle may emit light having a maximum emission wavelength of about 500 nm to about 650 nm. Accordingly, when the semiconductor nanoparticle is applied to a color conversion member, blue light may be absorbed to emit light having a wide color range. In an embodiment, the semiconductor nanoparticle 1 may emit green light having a maximum emission wavelength of about 500 nm to about 600 nm. Accordingly, when the semiconductor nanoparticle 1 is applied to a color conversion member, green with high luminance and high color purity may be realized.

In an embodiment, the semiconductor nanoparticle 1 may have a diameter of about 3.2 nm to about 14.4 nm. In an embodiment, the semiconductor nanoparticle 1 may have a diameter of about 4 nm to about 12 nm, for example, about 5 nm to about 11 nm, or about 6 nm to about 10 nm, or about 7 nm to about 9 nm.

In an embodiment, the semiconductor nanoparticle 1 may have an absorbance of about 0.1 or more, for example, about 0.15 or more, with respect to blue light having a wavelength of 450 nm. Accordingly, when the semiconductor nanoparticle 1 is applied to a light conversion layer of lighting apparatuses, the absorption of blue light from the light source is high, so that light conversion may occur highly efficiently, and high color purity of green may be realized.

In an embodiment, the semiconductor nanoparticle 1 may have a full width at half maximum (FWHM) of about 60 nm or less, for example, about 55 nm or less in an emission wavelength spectrum. When the FWHM of the semiconductor nanoparticle 1 satisfies the range described above, color purity and color reproducibility are excellent, and a wide viewing angle may be obtained.

In a core-shell quantum dot of $InP/ZnSe_{1-a}S_a$ (a is an integer from 0 to 1) composition of the related art, only 450 nm of blue excitation-light may be efficiently absorbed only in the 1 nP core layer, and only a part of ZnSe absorbs blue excitation-light. Therefore, in the case of a green quantum dot in which the size of 1 nP is small, the absorption of blue light could be sufficiently increased only when the thickness of the ZnSe shell is great. In this case, structural defects may occur due to the crystal decoupling between InP core and ZnSe shell.

The semiconductor nanoparticle 1 according to an embodiment has excellent absorbance of blue light, and may have reduced defects at the at least one of the interface between the core 10 and the inner shell 20, the interface between the inner shell 20 and the middle shell 30, and the interface between the middle shell 30 and the outer shell 40. Accordingly, even with sufficient thicknesses of the inner shell 20, the middle shell 30, and the outer shell 40, high optical efficiency and high color purity may be realized while the core 10 of the semiconductor nanoparticle 1 is protected.

The semiconductor nanoparticle 1 contains the phosphide of B, Al, or Ga in the inner cell 20 closest to the core 10 among the inner shell 20, the middle shell 30, and the outer shell 40, so that the leakage of electrons in the core 10 to the middle shell 30 and the outer shell 40 may be prevented and excellent quantum efficiency may be obtained.

In addition, because the semiconductor nanoparticle 1 includes, as described above, the inner shell 20 including the phosphide of B, Al, or Ga is formed between the core 10 including an InP-based material (for example, a ternary compound consisting of InP, In, P, and one of Groups I to VII elements, and transition metal-doped InP), and the outer shell 40 including Group II-VI compounds, the leakage of electrons in the core 10 to the middle shell 30 or the outer shell 40 may be reduced or prevented.

In an embodiment, the shape of the semiconductor nanoparticle 1 is not limited, and may be any shape used in the art. For example, the semiconductor nanoparticle 1 may be a generally spherical particle, a generally pyramidal particle, a generally multi-armed particle, a generally cubic nanoparticle, a generally nanotube particle, a generally nanowire particle, a generally nanofiber particle, or a generally nanoplate particle.

In an embodiment, the semiconductor nanoparticle 1 may include other compounds in addition to the above composition. In an embodiment, the core 10, the inner shell 20, the middle shell 30, or the outer shell 40 of the semiconductor nanoparticle 1 may further include one or more Group II-VI compounds, Groups III-VI compounds, Groups III-V compounds, Groups IV-VI compounds, Groups IV elements or compounds, Groups compounds, or a combination thereof.

The compounds of Groups II-VI may be selected from a binary compound selected from CdS, CdSe, CdTe, ZnS, ZnSe, ZnTe, ZnO, HgS, HgSe, HgTe, MgSe, MgS, and any mixture thereof; a ternary compound selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, any mixture thereof; and a quaternary compound selected from CdZnSeS, CdZnSeTe, CdZnSTe, CdHgSeS, CdHgSeTe, CdHgSTe, HgZnSeS, HgZnSeTe, HgZnSTe, and any mixture thereof. The compounds of Groups III-VI may include: a binary compound, such as $In_2S_3$ or $In_2Se$; a ternary compound, such as $InGaS_3$ or $InGaSe_3$; or any combination thereof.

For example, the compound of Groups III-V may be selected from: a binary compound selected from GaN, GaP, GaAs, GaSb, AlN, AlP, AlAs, AlSb, InN, InP, InAs, InSb, and any mixture thereof; a ternary compound selected from GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and any mixture thereof; and a quaternary compound selected from GaAlNAs, GaAlNSb, GaAlPAs, GaAlPSb, GaInNP, GaInNAs, GaInNSb, GaInPAs, GaInPSb, GaAlNP, InAlNP, InAlNAs, InAlNSb, InAlPAs, InAlPSb, and any mixture thereof, but embodiments are not limited thereto. The semiconductor compound of Groups III-V may include a Group II metal (for example, InZnP, etc.).

The compound of Groups IV-VI may be selected from: a binary compound selected from SnS, SnSe, SnTe, PbS, PbSe, PbTe, and any mixture thereof; a ternary compound selected from SnSeS, SnSeTe, SnSTe, PbSeS, PbSeTe, PbSTe, SnPbS, SnPbSe, SnPbTe, and any mixture thereof; and a quaternary compound selected from SnPbSSe, SnPbSeTe, SnPbSTe, and any mixture thereof. The element of Group IV may be selected from Si, Ge, and any mixture thereof. The compound of Group IV may be a binary compound selected from SiC, SiGe, and any mixture thereof.

The semiconductor compound of Groups may include a ternary compound, such as $AgInS$, $AgInS_2$, $CuInS$, $CuInS_2$, $CuGaO_2$, $AgGaO_2$, or $AgAlO_2$; or any combination thereof. The binary compound, the ternary compound, or the quaternary compound may exist in particles at uniform concentration, or may exist in the same particle in a state in which a concentration distribution is partially different.

In an embodiment, the inner shell 20, the middle shell 30, and/or the outer shell 40 may further include an oxide of metal or non-metal, a semiconductor compound, or a combination thereof. In an embodiment, the oxide of metal or non-metal may be a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, or NiO, or a ternary compound such as $MgAl_2O_4$, $CoFe_2O_4$, $NiFe_2O_4$, or $CoMn_2O_4$.

In an embodiment, the semiconductor compound may be CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or the like. According to another aspect, a method of manufacturing the semiconductor nanoparticle 1 is provided. The method of manufacturing the semiconductor nanoparticle 1 includes: preparing a first material by reacting a first precursor including indium with aminophosphine; preparing a second material including at least one of ZnSe and $ZnSe_xS_{1-x}$ where x is defined above; preparing a mixture including the first material, the second material, and a second precursor including boron, aluminum, or gallium (Ga); and adding a compound of Groups II-VI compounds to the mixture.

In an embodiment, the step of preparing the mixture including the first material, the second material, and the second precursor including boron, aluminum, or gallium (Ga) may include: i) the second precursor is added to the first material, and then, the second material is added thereto, or ii) the second material is added to the first material, and then, the second precursor is added thereto, or iii) the second material and the second precursor may be simultaneously added to the first material. In an embodiment, the amount ratio of the first material to the second precursor may be about 100:1 to about 1:10. In an embodiment, the first precursor is not particularly limited, but may include at least one of indium chloride, indium acetate, and indium oxide. In an embodiment, the second precursor is not limited, and may include at least one of $GaI_3$, $GaBr_3$, $GaCl_3$, $Ga_2Cl_4$, $Ga_2O_4$, GaN, $Ga(NO_3)_3 \cdot \alpha H_2O$, GaSb, $Ga_2(SO_4)_3$, $Ga_2S_3$, $Ga_2(SO_4)_3 \cdot \alpha H_2O$, $Ga(ClO_4)_3 \cdot \alpha H_2O$, $C_{12}H_{36}Ga_2N_6$, and $Ga(CH_3)_3$ (wherein $0 \leq \alpha \leq 10$). In an embodiment, the second precursor may be included together with a solvent.

The solvent may include trioctylphosphine (TOP), tributylphosphine (TBP), triphenylphosphine (TPP), diphenylphosphine (DPP), oleylamine (OLA), dodecylamine (DDA), hexadecylamine (HDA), octadecylamine (ODA), octylamine (OTA), trioctylamine (TOA), oleic acid (OA), 1-octadecene (ODE), or any mixture thereof. In an embodiment, the preparing of the mixture of the first material, the second material, and a second precursor may include heating the mixture. In an embodiment, the mixture may be heated to a temperature of about 120° C. to about 300° C. Details of the method of manufacturing semiconductor nanoparticles may be recognized by those skilled in the art by referring to Examples to be described later.

According to another aspect, a color conversion member including the semiconductor nanoparticle is provided. In an embodiment, at least one region of the color conversion member contains the semiconductor nanoparticle, and the semiconductor nanoparticle absorbs blue light to emit visible light other than blue light, for example, visible light with a maximum emission wavelength of about 500 nm to about 650 nm. Accordingly, a color conversion member including the semiconductor nanoparticle may be designed to absorb blue light and emit light having a wide color range of wavelength.

In an embodiment, at least one region of the color conversion member contains the semiconductor nanoparticle, and the semiconductor nanoparticle absorbs blue light to emit green light with a maximum emission wavelength of about 500 nm to about 600 nm. Accordingly, the color conversion member including the semiconductor nanoparticle may realize green light having high luminance and high color purity.

In an embodiment, an electronic apparatus including the color conversion member and a display is provided. In an embodiment, the display may emit blue light having a maximum emission wavelength of about 400 nm to about 490 nm. In an embodiment, at least one region of the color conversion member of the electronic apparatus may include the semiconductor nanoparticle, and the region may absorb blue light emitted from the display and may emit visible light other than blue light, for example, visible light having a maximum emission wavelength of about 500 nm to about 650 nm. Accordingly, a color conversion member including the semiconductor nanoparticle may be designed to absorb blue light, which is emitted from a display, and emit light having a wide color range of wavelength.

In an embodiment, at least one region of the color conversion member of the electronic apparatus may include the semiconductor nanoparticle, and the region may absorb blue light emitted from the display and may emit green light having a maximum emission wavelength of about 500 nm to about 600 nm. Accordingly, a color conversion member including the semiconductor nanoparticle may be designed to absorb blue light, which is emitted from a display, and emit green light having high luminance and high color purity. In an embodiment, the display may include an LCD, an organic light-emitting display, or an inorganic light-emitting display. The color conversion member and the electronic apparatus will be described in more detail with reference to the description below.

Figure 2:
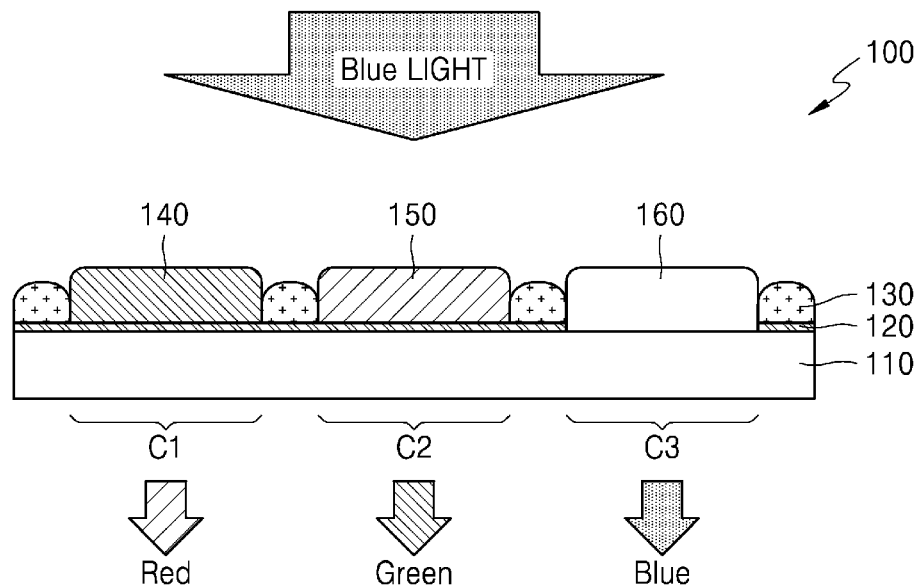
FIG. 2 is a schematic view illustrating an embodiment of a color conversion member having a semiconductor nanoparticle constructed according to principles of the invention.

FIG. 2 is a schematic view illustrating an embodiment of a color conversion member having a semiconductor nanoparticle constructed according to principles of the invention.

Referring to FIG. 2, the color conversion member 100 includes, for generating different colors, a first pixel area C1, a second pixel area C2, and a third pixel area C3. In an embodiment, when external light (for example, blue light) enters the color conversion member 100, red light, green light and blue light may be emitted from, respectively, the first pixel area C1, the second pixel area C2, and the third pixel area C3.

The first pixel area C1 converts the incident light into light of a first color having a wavelength band longer than the wavelength of the incident light, and emits the converted light. In an embodiment, the first pixel region C1 may include a first color conversion layer 140 including light-emitting particles. In this regard, the light-emitting particles are particles that emit light. The light-emitting particles may include the semiconductor nanoparticle described herein. The light-emitting particles may emit light with a wavelength of about 600 nm to about 700 nm (that is, red light) when light (for example, blue light) is irradiated from the outside. Accordingly, when blue light enters the first pixel area C1, the blue light may be converted into red light by the semiconductor nanoparticle included in the first color conversion layer 140.

The first color conversion layer 140 may further include a scattering body to increase the optical path of the incident light. In an embodiment, in the first pixel area C1, a first band cut filter 120 may be further formed to block blue light that has not been color-converted in the first color conversion layer 140 from being emitted from the first pixel area C1.

The first band cut filter 120 refers to a filter that optionally transmits light having a specific wavelength band. In an embodiment, the first band cut filter 120 may include a single layer or a plurality of layers, for transmitting light having a specific wavelength band and absorbing or reflecting light outside the specific wavelength band. In this regard, when the first band cut filter 120 includes a plurality of layers, the layers may include different materials, and different refractive indexes. In an embodiment, the first band cut filter 120 may be a yellow color filter that absorbs blue light and transmits light other than blue light.

The second pixel area C2 converts the incident light into light of a second color having a wavelength band longer than the wavelength of the incident light, and emits the converted light. In an embodiment, the second pixel region C2 may include a second color conversion layer 150 including semiconductor nanoparticles. In this case, the description of the semiconductor nanoparticles is the same as described herein. The semiconductor nanoparticle may emit light having a wavelength of about 500 nm to about 600 nm (that is, green light) when light (for example, blue light) is irradiated from the outside as described herein. Accordingly, when blue light enters the second pixel region C2, blue light may be converted into green light by the semiconductor nanoparticle included in the second color conversion layer 150.

The second color conversion layer 150 may further include a scattering body to increase the optical path of the incident light. In an embodiment, in the second pixel area C2, the first band cut filter 120 may be further formed to block blue light that has not been color-converted in the second color conversion layer 150 from being emitted from the second pixel area C2. The third pixel area C3 may include a scattering material layer 160 that scatters incident light. The scattering material layer 160 allows the incident blue light to pass therethrough intact, so blue light is emitted from the third pixel area C3.

Figure 3:
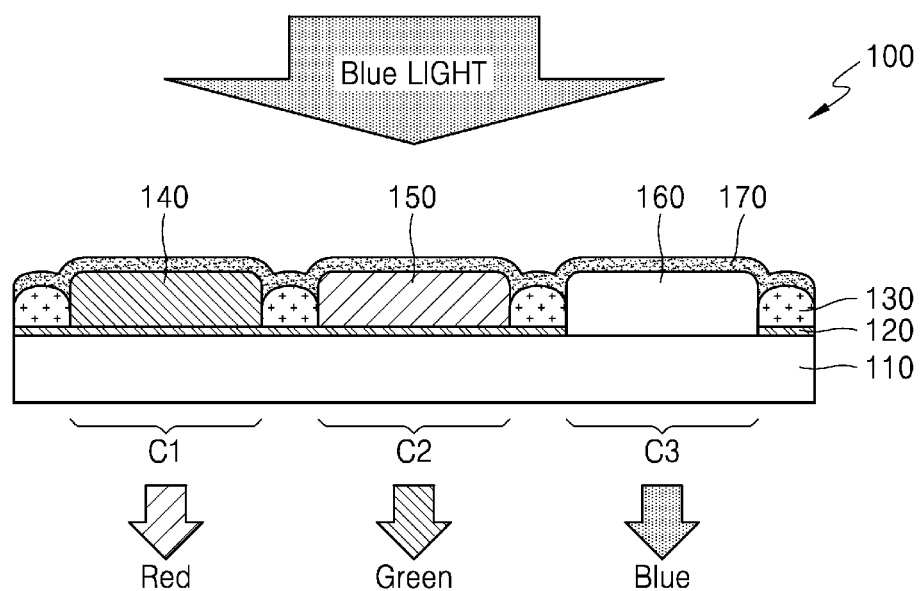
FIG. 3 is a schematic view illustrating another embodiment of a color conversion member constructed according to principles of the invention.

FIG. 3 is a schematic view illustrating another embodiment of a color conversion member constructed according to principles of the invention.

Referring to FIG. 3, to transmit incident light while preventing color-converted light from being emitted in a direction opposite to the incident direction, a second band cut filter 170 may be further formed on a surface of each of the first color conversion layer 140, the second color conversion layer 150, and the scattering material layer 160 on the side thereof in which the incident light enters.

In an embodiment, the second band cut filter 170 refers to a filter that transmits light having a specific wavelength band and reflects other light. In an embodiment, the second band cut filter 170 may be a filter capable of transmitting blue light and reflecting green light and red light. Due to the arrangement of the second band cut filter 170 on the surface of each of the first color conversion layer 140, the second color conversion layer 150, and the scattering material layer 160 on the side thereof in which the incident light enters, the color-converted light which is emitted from semiconductor nanoparticles and travels in the direction in which incident light enters, may be reflected to allow the same to travel to the outside. Therefore, optical conversion efficiency may be improved through the second band cut filter 170.

In an embodiment, the second band cut filter 170 may include a single layer or a plurality of layers. In an embodiment, the second band cut filter 170 may include a plurality of layers having different refractive indexes. In an embodiment, the second band cut filter 170 may include a plurality of layers in which a first layer and a second layer are alternately stacked. In an embodiment, the first layer may have a low reactive index and the second layer may have a high reactive index, and vice versa.

In an embodiment, the second band cut filter 170 may include a silicon oxide, a silicon oxycarbide, a silicon nitride, and a metal oxide. In an embodiment, the first layer may include a silicon oxide, a silicon oxycarbide, and a silicon nitride, and the second layer may include oxides of Ti, Ta, Hf, and Zr. In an embodiment, the first layer may include oxides of Ti, Ta, Hf, and Zr, and the second layer may include a silicon oxide, a silicon oxycarbide, and a silicon nitride.

In an embodiment, the second band cut filter 170 may include a silicon nitride layer and a silicon oxide layer. In an embodiment, the second band cut filter 170 may include a plurality of layers in which a silicon nitride layers and a silicon oxide layers are alternately stacked. In an embodiment, the first pixel area C1, the second pixel area C2, and the third pixel area C3 may be formed on a transparent substrate 110, and a partition wall 130 for partitioning pixel areas may be formed on the transparent substrate 110.

FIG. 4 is a schematic cross sectional view of an embodiment of an electronic apparatus constructed according to principles of the invention. FIG. 5 is a schematic cross sectional view of another embodiment of an electronic apparatus constructed according to principles of the invention. FIG. 6 is a schematic cross sectional view of a further embodiment of an electronic apparatus constructed according to principles of the invention.

According to FIGS. 4 to 6, an electronic apparatus including a color conversion member 1300 and displays is provided. In an embodiment, referring to the description provided with reference to FIGS. 2 and 3, the color conversion member 1300 may include a first color conversion layer 1340 for converting the incident light emitted from the display into light of the first color and emitting the converted light, a second color conversion layer 1350 for converting the incident light emitted from the display into light of the second color and emitting the converted light, and a scattering material layer 1360 for transmitting incident light emitted from the display.

In an embodiment, the electronic apparatus may further include a first band cut filter that is located on a color conversion member and blocks the emission of light in the same wavelength band as the incident light. The first band cut filter may be the same as described herein. In an embodiment, the light of the first color may be red light, and the second color may be green light.

In an embodiment, the electronic apparatus may further include a second band cut filter that is between the display and the color conversion member and blocks light emitted from the color conversion member to the display. The second band cut filter may be the same as described herein.

In an embodiment, the display may include an LCD, 2300 (as shown in FIG. 4), an organic light-emitting display 2400 (as shown in FIG. 5 and FIG. 6), or an inorganic light-emitting display. In an embodiment shown in FIG. 4, the display includes an LCD 2300, and the LCD 2300 may include a light source that emits blue light.

Referring to FIG. 4, the color conversion member 1300 is positioned on a surface of an upper substrate 1310 facing a liquid crystal layer 2340, and a LCD 2300 includes a liquid crystal layer 2340, a thin film transistor (TFT) array layer 2330, a lower substrate 2320, and a light source 2310 emitting blue light.

A common electrode may be provided between the liquid crystal layer 2340 and the color conversion member 1300, and a pixel electrode may be provided between the liquid crystal layer 2340 and the thin film transistor array layer 2330. Because the liquid crystal layer 2340 is provided between the pixel electrode and the common electrode, due to the electric field formed by the pixel electrode and the common electrode, liquid crystal molecules are aligned in a certain direction to block or pass light, thereby controlling the amount of light.

Also, a first orientation film may be provided between the liquid crystal layer 2340 and the common electrode, and a second orientation film may be provided between the liquid crystal layer 2340 and the pixel electrode. The first and second orientation films uniformly orientate liquid crystal molecules. The orientation films may be formed using a material well known in the art. In an embodiment, the orientation films may include a polyimide.

In addition, the thin film transistor array layer 2330, may include a plurality of transistors, a gate wire for applying a gate signal to each of the transistors, and a data wire for applying a data signal to each of the transistors, and patterned pixel electrodes may be provided on the thin film transistor array layer 2330. The pixel electrode is connected to a drain electrode of a transistor formed on the thin film transistor array layer 2330 to receive a data voltage.

In an embodiment, a first polarizing plate may be provided between the common electrode and the color conversion member 1300. The first polarizing plate may be a wire-grid polarizer (WGP). The WGP may be configured with a regular array of fine metal wires arranged generally in parallel. The WGP may provide high efficiency and high luminance by reflecting a polarization component generally parallel to a metal grid and transmitting a polarization component generally perpendicular to the metal grid while reusing the reflected light. In addition, the first polarizing plate may be a thin film including a polymer material.

In addition, a second polarizing plate may be further provided between the light source 2310 and the lower substrate 2320. The upper substrate 1310 and the lower substrate 2320 may include various materials such as a glass or a transparent plastic. In an embodiment, the upper substrate 1310 and the lower substrate 2320 may each include a flexible substrate. The light source 2310 may be a backlight unit that emits blue light.

Referring to FIG. 5, the display may be an organic light-emitting display 2400 emitting blue light. In an embodiment, the display includes an organic light-emitting display 2400, the organic light-emitting display 2400 includes an organic light-emitting device, and the organic light-emitting device includes an organic compound, and includes an organic emission layer emitting blue light. An organic light-emitting display 2400 may include an emission layer 2410 emitting blue light, a TFT array layer 2430, and a lower substrate 2420. The TFT array layer 2430 and the lower substrate 2420 are the same as described herein.

An organic light-emitting device including the emission layer 2410 emitting blue light may be included between the TFT array layer 2430 and the color conversion member 1300. The organic light-emitting device, may include: a first electrode; a second electrode facing the first electrode; and an organic layer between the first electrode and the second electrode and including the emission layer 2410, wherein the organic layer may include i) a hole transport region between the first electrode and the emission layer 2410 and including a hole injection layer, a hole transport layer, a buffer layer, an electron blocking layer, or a combination thereof, and ii) an electron transport region between the emission layer 2410 and the second electrode and including a hole blocking layer, a buffer layer, an electron transport layer, an electron injection layer, or a combination thereof.

In an embodiment, the organic light-emitting device may include an organic layer including two or more emission layers. In an embodiment, the organic light-emitting device may include an organic layer between a first electrode and a second electrode and including two or more light-emitting units, each including a hole transport layer, an emission layer, and an electron transport layer. A charge generation layer (CGL) may be included between the two or more light-emitting units.

The electronic apparatus as illustrated in FIG. 5 may be manufactured in such a way that a color conversion member 1300 may be separately manufactured by forming the first and second color conversion layers 1340 and 1350 and the scattering material layer 1360 on the upper substrate 1310, and then the color conversion member 1300 may be bonded to an organic light-emitting display 2400.

In an embodiment, the electronic apparatus according to FIG. 6 may be manufactured by a sequential lamination process from the lower substrate 2420, on which the TFT array layer 2430 is formed, to the color conversion member 1300. In this case, there is no need for a separate upper substrate (see 1310 in FIG. 5) to form the color conversion member 1300, nor for the process of bonding the organic light-emitting display 2400 and the color conversion member 1300. Accordingly, the thickness of an electronic apparatus may be reduced and the manufacturing process therefor may be simplified.

In an embodiment, the display includes an inorganic light-emitting display, the inorganic light-emitting display includes an inorganic light-emitting device, and the inorganic light-emitting device includes an inorganic compound, and includes an inorganic emission layer emitting blue light.

Hereinafter, semiconductor nanoparticles according to examples will be described in more detail.

EXAMPLES

Example 1: Synthesis of InP/GaP/ZnSe$_{0.5}$S$_{0.5}$/ZnS Semiconductor Nanoparticle An amount of 1.0 mmol of InCl$_3$ and 5 g of oleyl amine were mixed in a three-neck flask, and then, oxygen and moisture were removed therefrom while degassing and stirring at 100° C. for 120 minutes to form a reaction solution. Then, the reaction solution was heated up to 290° C. in an argon atmosphere, maintained for a certain period of time, cooled to 220° C., and then 0.25 mmol of P(N(CH$_3$)$_2$) was rapidly provided thereto, and reacted for a certain period of time to grow an InP quantum dot core.

Next, the vacuum was released and the flask was filled with an inert gas, and then, the temperature was raised to 230° C. At 230° C., 1.0 mmol zinc oleate, 1.0 mmol trioctylphosphine selenide, 0.05 mmol GaI$_3$ and 10 mL of trioctylphosphine were added thereto, and reacted for 1 hour to form a GaP inner shell and a zinc selenide intermediate shell.

Then, 2 mmol zinc oleate and 2 mmol trioctylphosphine sulfide were added thereto and reacted for 1 hour to form a zinc sulfide shell to obtain the semiconductor nanoparticle of Example 1.

Comparative Example 1: Synthesis of InP/ZnSe$_{0.5}$S$_{0.5}$/ZnS Semiconductor Nanoparticle Semiconductor nanoparticles of Comparative Example 1 were obtained in the same manner as in Example 1, except that 0.05 mmol GaI$_3$ and 10 mL of trioctylphosphine were not added.

Example 2

Semiconductor nanoparticles of Example 2 were obtained in the same manner as in Example 1, except that the amount of GaI$_3$ was 0.10 mmol.

Example 3

Semiconductor nanoparticles of Example 3 were obtained in the same manner as in Example 1, except that the amount of GaI$_3$ was 0.15 mmol.

Evaluation Example 1

In relation to the semiconductor nanoparticles manufactured according to Example 1 and Comparative Example 1, the maximum emission wavelength, the FWHM, and the emission quantum yield were evaluated. Results thereof are shown in Table 1 and FIG. 7.

The measurement method is as follows: in relation to a solution (solvent: hexane or chloroform) in which the optical density of semiconductor nanoparticles was adjusted to be 0.01 to 0.05, the maximum emission wavelength and the FWHM were evaluated from the photoluminescence (PL) spectrum measured using a PL spectrometer. The emission quantum yield was evaluated using an absolute quantum efficiency measuring instrument.

TABLE 1

| Semiconductor nanoparticles | Maximum emission wavelength (nm) | FWHM (nm) | Emission quantum yield (%) |
|---|---|---|---|
| Example 1 | InP/GaP/ZnSe$_{0.5}$S$_{0.5}$/ZnS | 523 | 37 | 90 |
| Comparative Example 1 | InP/ZnSe$_{0.5}$S$_{0.5}$/ZnS | 528 | 39 | 80 |

Figure 7:
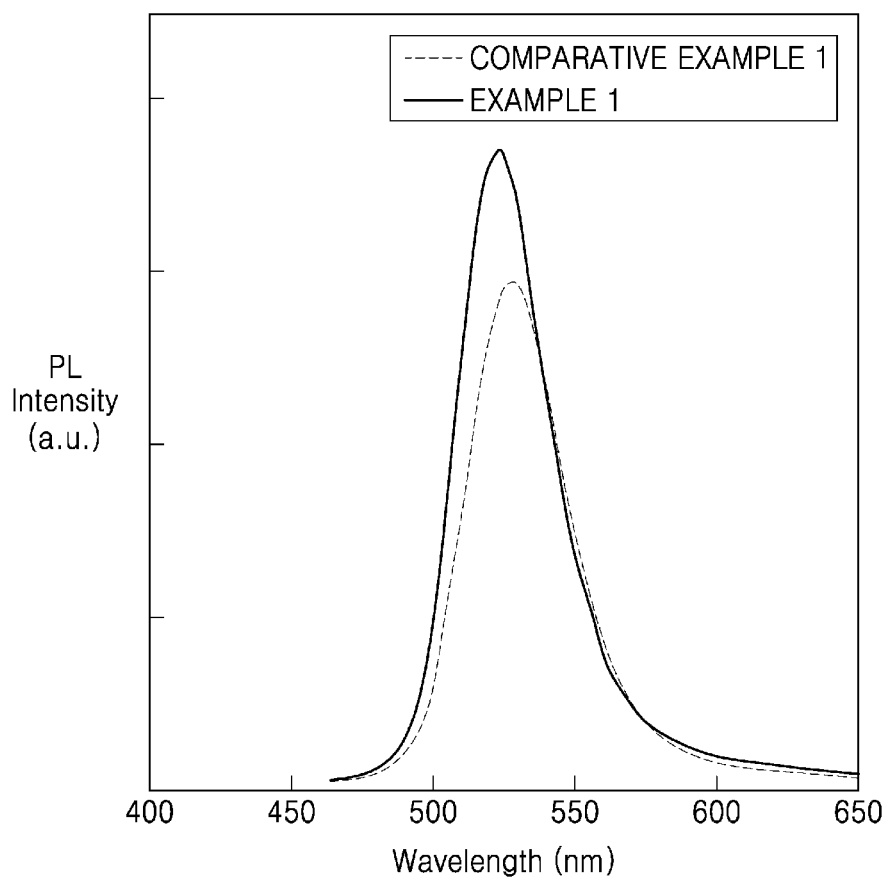
FIG. 7 is a graphical depiction of a photoluminescence spectrum of Example 1 made according to the principles of the invention and Comparative Example 1.

FIG. 7 is a graphical depiction of a photoluminescence spectrum of Example 1 made according to the principles of the invention and Comparative Example 1.

Table 1 and FIG. 7, show that the semiconductor nanoparticles of Example 1 had a significant and unexpectedly narrow FWHM and excellent emission quantum yield.

Evaluation Example 2

Figure 8A:
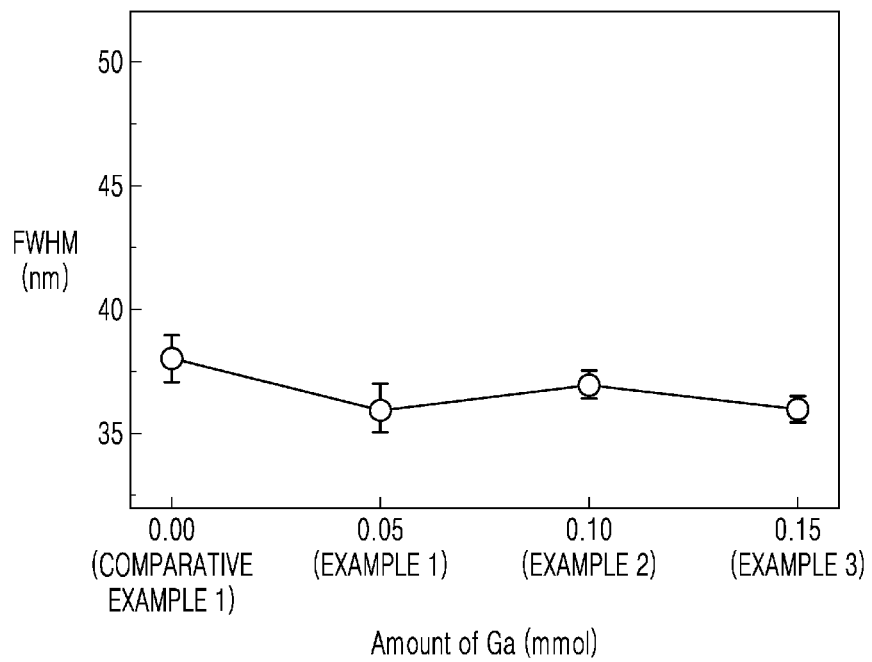
FIG. 8A is a graphical depiction of a full width at half maximum with respect to the amount of gallium precursor of a semiconductor nanoparticle of examples constructed according to principles of the invention and a comparative example.

FIG. 8A is a graphical depiction of a full width at half maximum with respect to the amount of gallium precursor of a semiconductor nanoparticle of examples constructed according to principles of the invention and a comparative example.

Figure 8B:
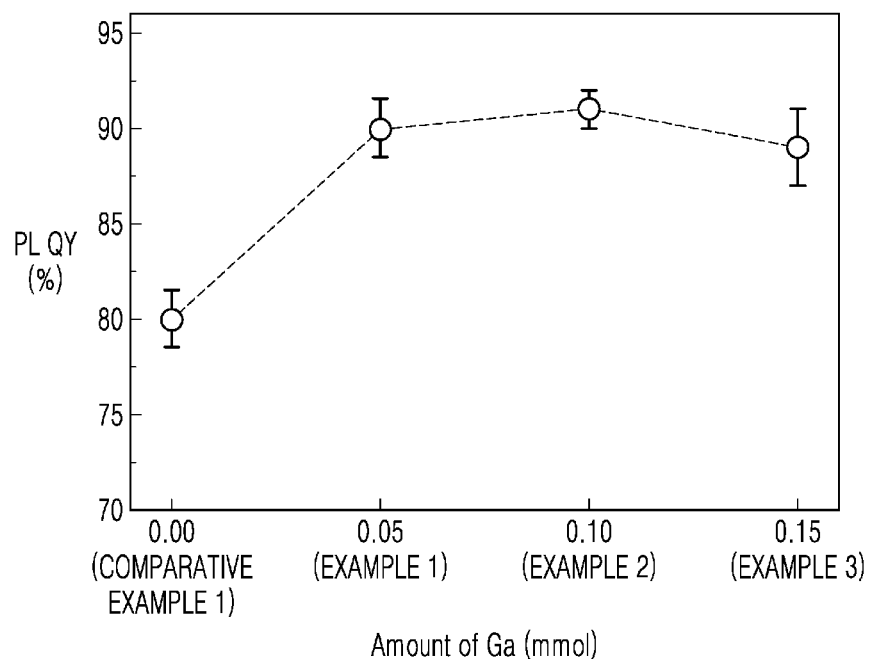
FIG. 8B is a graphical depiction of quantum efficiency with respect to the amount of gallium precursor of a semiconductor nanoparticle of examples constructed according to principles of the invention and a comparative example.

FIG. 8B is a graphical depiction of quantum efficiency with respect to the amount of gallium precursor of a semiconductor nanoparticle of examples constructed according to principles of the invention and a comparative example.

In relation to the semiconductor nanoparticles manufactured according to Examples 1 to 3 and Comparative Example 1, the FWHM and the emission quantum yield were evaluated. Results thereof are shown in FIGS. 8A and 8B. The measurement method may be the same as described herein. FIGS. 8A and 8B show that the semiconductor nanoparticles of Examples 1 to 3 had a significant and unexpectedly narrow FWHM and excellent emission quantum yield.

Semiconductor nanoparticles made according to the principles and embodiments of the invention have a narrow FWHM of a photoluminescence spectrum and excellence in quantum efficiency. Accordingly, a color conversion member for a display including the semiconductor nanoparticles have excellent optical conversion efficiency and can exhibit high color purity.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A semiconductor nanoparticle comprising:
a central portion including at least one of i) InP, ii) a ternary compound consisting of indium, phosphorus, and one element of Groups I-VII, and iii) InP doped with at least one transition metal of Groups I-VII;
an inner portion proximate to the central portion and including a phosphide of at least one of boron, aluminum, and gallium;
a middle portion proximate to the inner portion and including at least one of ZnSe and ZnSe$_x$S$_{1-x}$; and
an outer portion proximate to the middle portion and including one or more compounds of Groups II-VI, wherein the middle portion comprises a middle shell including multi-layered shells and further includes, in a portion thereof adjacent to the inner portion, a doping layer containing at least one of ZnSe and ZnSe$_x$S$_{1-x}$ which are doped with at least one metal of B, Al, and Ga, and xis 0<x<1.

2. The semiconductor nanoparticle of claim 1, wherein the semiconductor nanoparticle is configured to emit visible light other than blue light.

3. The semiconductor nanoparticle of claim 1, wherein the semiconductor nanoparticle is configured to emit light having a maximum emission wavelength of about 500 nm to about 650 nm.

4. The semiconductor nanoparticle of claim 1, wherein the central portion comprises a core, the inner portion comprises an inner shell directly covering the core, the middle portion comprises a middle shell directly covering the inner shell, and the outer portion comprises an outer shell directly covering the middle shell.

5. The semiconductor nanoparticle of claim 1, wherein the central portion comprises a core including at least one of InP, InGaP, InAlP, Cu-doped InP, Mn-doped InP, and Ag-doped InP.

6. The semiconductor nanoparticle of claim 1, wherein the inner portion comprises an inner shell including at least one of BP, AlP, and GaP.

7. The semiconductor nanoparticle of claim 1, wherein the compound of Groups II-VI includes Zn, and is a binary compound or a ternary compound.

8. The semiconductor nanoparticle of claim 1, wherein the one or more compounds of Groups II-VI comprise at least one of ZnS, ZnSe, ZnTe, ZnO, ZnSeS, ZnSeTe, and ZnSTe.

9. The semiconductor nanoparticle of claim 1, wherein the one or more compounds of Groups II-VI comprise ZnS.

10. The semiconductor nanoparticle of claim 1, wherein a ratio of a total molar number of B, Al, or Ga contained in the inner portion to a molar number of In contained in the central portion is about 0.01 to about 10.

11. The semiconductor nanoparticle of claim 1, wherein the inner portion comprises an inner shell having a thickness of about 0.1 nm to about 0.7 nm.

12. The semiconductor nanoparticle of claim 1, wherein a full width at half maximum of an emission wavelength spectrum of the semiconductor nanoparticle is about 60 nm or less.

13. A method of manufacturing the semiconductor nanoparticle of claim 1, the method comprising the steps of:
preparing a first material by reacting a first precursor including indium with aminophosphine;
preparing a second material including at least one of ZnSe and ZnSe$_x$S$_{1-x}$;
preparing a mixture including the first material, the second material, and a second precursor including boron, aluminum, or gallium; and
adding a compound of Groups II-VI to the mixture.

14. The method of claim 13, wherein the step of preparing the mixture including the first material, the second material, and the second precursor including boron, aluminum, or gallium comprises i) the second precursor is added to the first material, and then the second material is added thereto, or ii) the second material is added to the first material, and then the second precursor is added thereto, or iii) the second material and the second precursor are simultaneously added to the first material.

15. A color conversion member including a semiconductor nanoparticle, wherein the semiconductor nanoparticle comprises:

a central portion including at least one of i) InP, ii) a ternary compound consisting of indium, phosphorus, and an element of Groups I-VII, and iii) InP doped with at least one transition metal of Groups I-VII;

an inner portion covering the central portion and including a phosphide of at least one of boron, aluminum, and gallium;

a middle portion covering the inner portion and including at least one of ZnSe and $ZnSe_xS_{1-x}$; and an outer portion covering the middle portion and including a compound of Groups II-VI, wherein the middle portion comprises a middle shell including multi-layered shells and further includes, in a portion thereof adjacent to the inner portion, a doping layer containing at least one of ZnSe and $ZnSe_xS_{1-x}$ which are doped with at least one metal of B, Al, and Ga, and x is $0<x<1$.

16. An electronic apparatus comprising:

the color conversion member of claim 15; and a display.

17. The electronic apparatus of claim 16, wherein at least one region of the color conversion member includes the semiconductor nanoparticle and is configured to absorb visible light emitted from the display.

18. The electronic apparatus of claim 17, wherein the at least one region of the color conversion member is configured to emit visible light other than blue light.

19. The electronic apparatus of claim 16, wherein the display includes a liquid crystal display, an organic light-emitting display, or an inorganic light-emitting display.

\* \* \* \* \*